(12) United States Patent
Symons

(10) Patent No.: US 6,337,226 B1
(45) Date of Patent: Jan. 8, 2002

(54) SEMICONDUCTOR PACKAGE WITH SUPPORTED OVERHANGING UPPER DIE

(75) Inventor: Bruce Symons, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,895

(22) Filed: Feb. 16, 2000

(51) Int. Cl.⁷ .......................... H01L 21/44; H01L 21/48; H01L 21/50; H01L 23/48; H01L 23/52; H01L 29/40

(52) U.S. Cl. .................. 438/109; 438/125; 257/777

(58) Field of Search ................. 438/109, 125; 257/777

(56) References Cited

U.S. PATENT DOCUMENTS 6,215,193 B1 * 4/1999 Tao et al. .................... 257/777
6,238,949 B1 * 6/1999 Nguyen et al. .............. 438/106

* cited by examiner

*Primary Examiner*—Charles Bowers
*Assistant Examiner*—Nema Berezny

(57) ABSTRACT

A circuit assembly is provided with a lower die and an upper die offset and stacked on the lower die. A supporting material, such as a dielectric molding compound or epoxy resin, is dispensed along the side surfaces of the lower die under the overhanging parts of the upper die to provide support for the upper die, thereby preventing cracking of the upper die during wire bonding.

12 Claims, 4 Drawing Sheets

SEMICONDUCTOR PACKAGE WITH SUPPORTED OVERHANGING UPPER DIE

RELATED APPLICATIONS

This application contains subject matter related to subject matter disclosed in co-pending U.S. application Ser. No. 09/559,405, filed Apr. 26, 2000.

TECHNICAL FIELD

The present invention relates to semiconductor packaging technology. The present invention has particular applicability to semiconductor packages containing multiple semiconductor dies and to wire bonding stacked dies to substrates.

BACKGROUND ART

Ongoing advances in solid-state electronic devices impose continuous demands for integrated circuit devices with increased functionality, density, and performance. In response, multi-chip modules have evolved comprising a printed circuit board substrate to which a series of separate components are directly attached. Multi-chip devices advantageously increase circuit density with attendant improvements in signal propagation speed and overall device weight.

A conventional method of effecting electrical connection between a die and electric leads comprises wire bonding. Wire bonding techniques effect electrical interconnections among components in a discreet package by means of fine wire connectors welded to the individual components. Accordingly, a fine wire conductor or bond wire has one end wire bonded to an electrical lead on the substrate surface and the other end wire bonded to an electrical contact or bond pad on the die or chip.

In fabricating conventional multi-chip modules or multi-chip packages, semiconductor dies are superimposed, with the upper die typically overlapping at least one side surface of the underlying die. Overlapping parts of the upper die extending beyond the side surfaces of the lower die contain bond pads on the upper surface to which bond wires are wire bonded.

For example, a conventional multi-die structure is schematically illustrated in FIGS. 1 and 2, wherein similar elements are denoted by similar reference numerals. Adverting to FIG. 1, substrate 10 has mounted thereon in a conventional manner first die 11 and second die 12 positioned above first die 1 such that overlapping portions 12A and 12B of second die 12 extend beyond or overlap the side surfaces of first die 11A and 11B, respectively. Bond pads 13 on the upper surface of first die 11 are electrically connected to conductor 16 on substrate 10 by wire bonds 15. Bond pads 14 on the upper surface of overlapping parts 12A and 12B of upper die 12 are connected to conductors 16 by wire bonds 15. Typically, the upper die 12 is positioned on first die 11 with a dielectric bonding material 20, such as an epoxy resin, therebetween, as shown in FIG. 2. Bond pad 14 on overlapping part 12A extending beyond the side surface 11A of underlying die 11 is wire bonded to a contact (not shown) on the main surface of substrate 10 with bond wire 15, as illustrated in FIG. 2. However, overlapping part 12A of upper die 12 is not supported on its underside. Accordingly, upon wire bonding bond wire 15 to bond pad 14 on the overlapping part 12A of upper die 12, cracking occurs in upper die 12, as indicated by arrow 21, with an attendant decrease in the durability of the resulting packaged semiconductor device and/or increase in rejection rate.

Accordingly, there exists a need for a semiconductor package comprising a circuit assembly with stacked, offset dies exhibiting improved reliability and structural integrity. There also exists a need for a method of manufacturing a packaged semiconductor device comprising a circuit assembly with stacked, offset dies with improved reliability and structural integrity.

SUMMARY OF THE INVENTION

An advantage of the present invention is a circuit assembly comprising offsetting stacked dies exhibiting improved reliability and structural integrity.

Another advantage of the present invention is a method of manufacturing a circuit assembly comprising stacked upper and lower dies without cracking of an overlapping portion of the upper die during wire bonding.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a circuit assembly comprising: a substrate having a main surface; a first die having an upper surface, a lower surface and side surfaces, the lower surface of the first die positioned on the main surface of the substrate; a dielectric support material adjacent at least one side surface of the first die; a second die, having an upper surface and a lower surface, the second die positioned such that part of the second die is supported by the first die and another part of the second die overlaps a side surface of the first die and is supported by the dielectric support material; a bond pad on the upper surface of the second die on the overlapping part supported by the dielectric support material; and a bond wire connected to a conductor on the main surface of the substrate and wire bonded to the bond pad.

Another advantage of the present invention is a method of manufacturing a circuit assembly, the method comprising: providing a substrate having a main surface; positioning a first die having an upper surface, a lower surface and side surfaces, such that the lower surface of the first die is on the main surface of the substrate; dispensing a dielectric support material adjacent at least one side surface of the first die; positioning a second die, having an upper surface and a lower surface, such that part of the second die is supported by the first die and another part of the second die overlaps a side surface of the first die and is supported by the dielectric support material, the upper surface of the second die having a bond pad on the overlapping part supported by the dielectric material; and wire bonding a bond wire to the bond pad, the bond wire being connected to a conductor on the main surface of the substrate.

Embodiments of the present invention comprise dispensing a conventional molding compound or epoxy resin, conventionally employed in semiconductor packaging, as the dielectric support material. Embodiments of the present invention also include dispensing a molding compound or an epoxy resin on the upper surface of the first die extending along at least to opposing side surfaces of the first die and positioning the second die such that parts thereof overhang or extend beyond the two opposing side surfaces of the first die such that the overhanging parts of the second die are supported by the molding compound or epoxy resin. A plurality of bond wires are wire bonded to the bond pads on each of the overhanging or overlapping parts of the second die, the bond wires being connected to bond fingers or conductors on the main surface of the substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and descriptions are to be regarded as illustrative in nature, and not as restrictive.

DESCRIPTION OF THE PRESENT INVENTION

The present invention addresses and solves the problem of upper die cracking when wire bonding a bond wire to a portion of the upper die overlapping and, hence, not supported by an underlying die of a stacked die structure. In accordance with embodiments of the present invention, a dielectric material is dispensed so that it underlies the overlapping part of the upper stacked die and provides support for such overlapping part of the upper die during wirebonding, thereby preventing the generation of crack-inducing stresses. Embodiments of the present invention include dispensing a dielectric support material, such as a bonding compound conventionally employed in semiconductor packaging, adjacent the side surfaces of the lower die over which parts of the stacked upper die overlap or extend beyond. A suitable epoxy resin for use in implementing embodiments of the present invention is QMI 536 obtainable from Quantum Materials, Inc. located in San Diego, Calif.

In accordance with embodiments of the present invention, the second die is positioned overlying the first die such that part of the second die is supported by the first die and the dielectric material therebetween, while the other part of the second die is supported by dielectric support material. In this way, the dispensed dielectric material provides support during wire bonding of bond wires to the bond pads on the overlapping parts of the stacked upper die. Thus, the overlapping portions of the second die are supported such that, during wire bonding to bond pads on the upper surface of the second die, sufficient support is provided to avoid cracking.

Embodiments of the present invention comprise positioning the upper die overlying the lower die such that the upper die overlaps and extends beyond two side surfaces of the lower die. The overlapping portions of the upper die typically contains a plurality of bond pads. Wire bonding is conducted to connect bond wires to the bond pads thereby providing electrical connection to bond fingers or conductors on the substrate surface. During wire bonding to any of the pad bonds on the upper surface of the overlapping parts of the upper die, sufficient support is provided by the dispensed dielectric support material to avoid the generation of crack inducing stresses.

It should be understood that except as set forth herein, the materials and bonding techniques employed in the various embodiments of the present invention are conventional and, hence, not set forth here and in detail in order not to obscure the present invention. For example, suitable conventional substrates for use in embodiments of the present invention typically comprise plated via holes therethrough and solder balls on the underside for bonding to a conventional printed circuit board.

Figure 1:
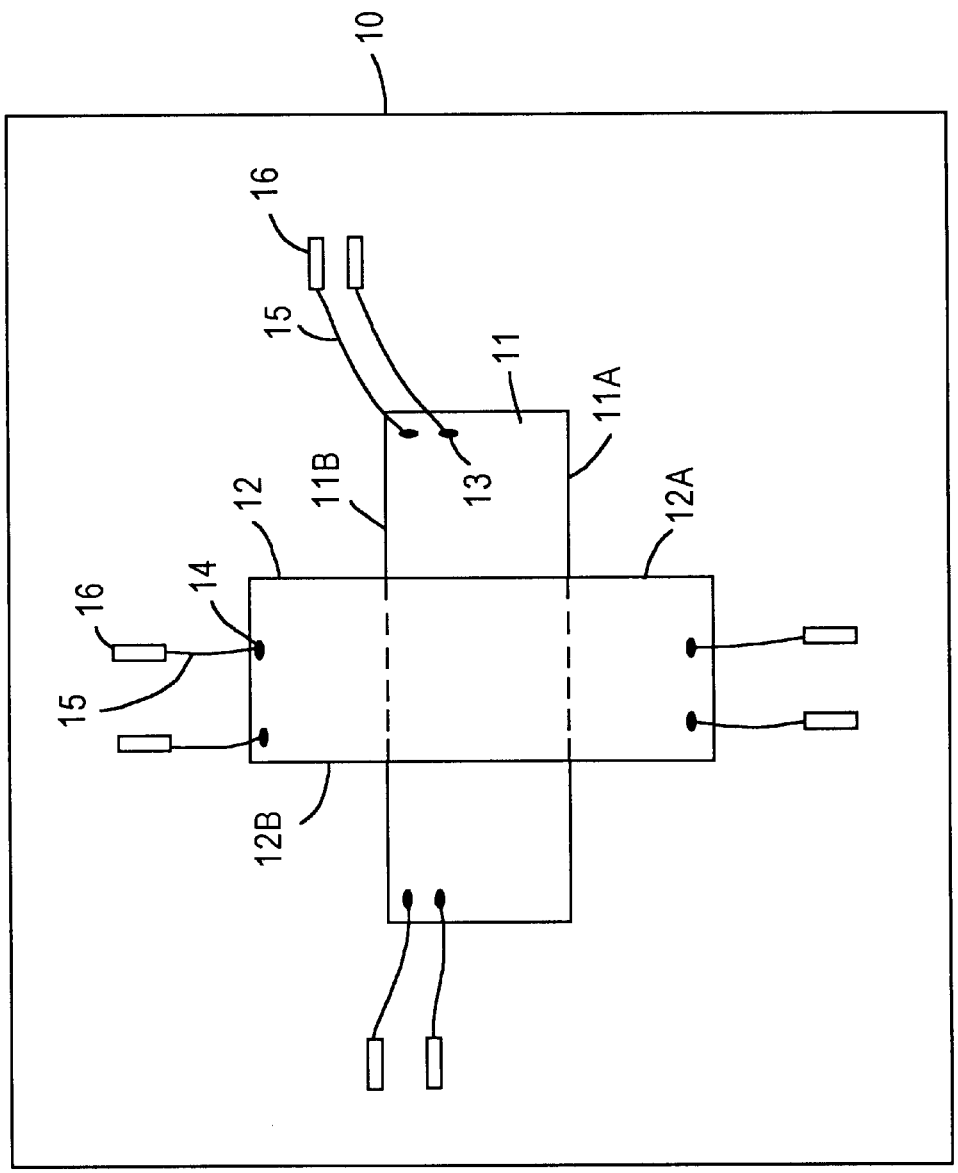
FIG. 1 schematically illustrates, in plan view, a conventional stacked die structure.
Figure 2:
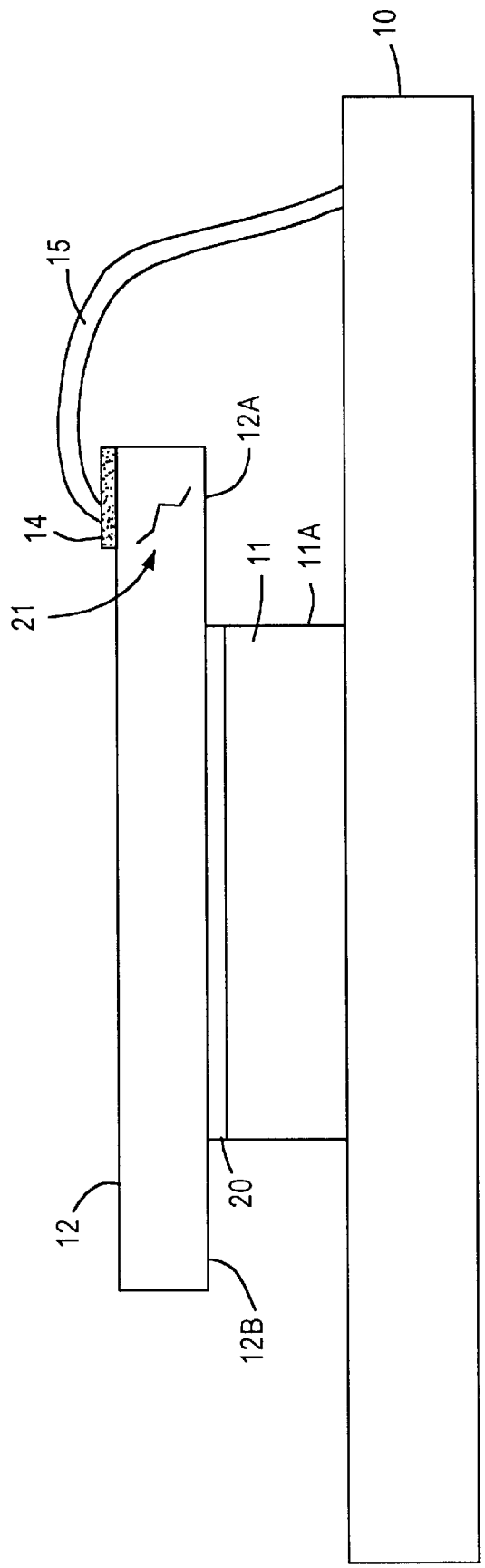
FIG. 2 schematically illustrates, in cross-sectional view, the conventional stacked die structure of FIG. 1.
Figure 3:
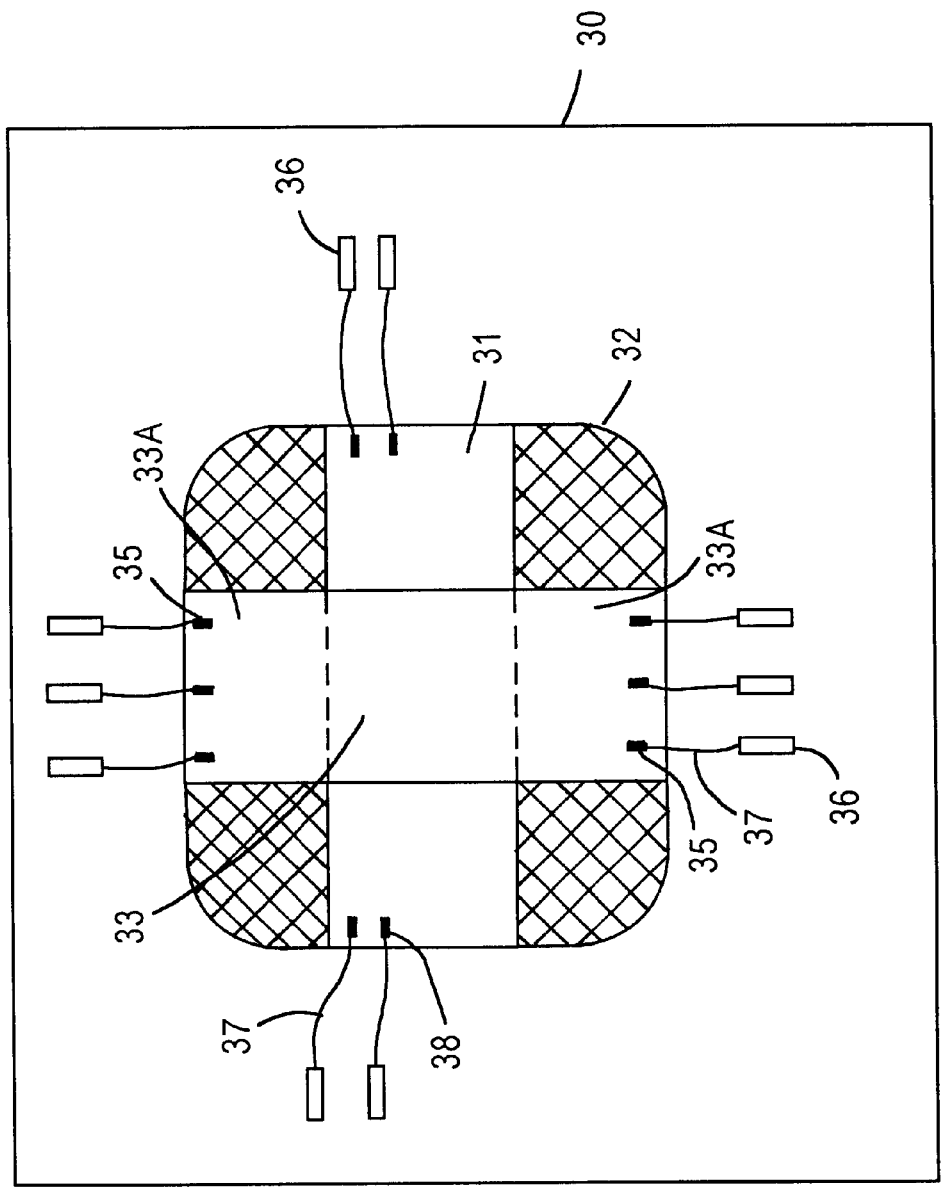
FIG. 3 schematically illustrates, in plan view, a stacked die structure in accordance with an embodiment of the present invention.
Figure 4:
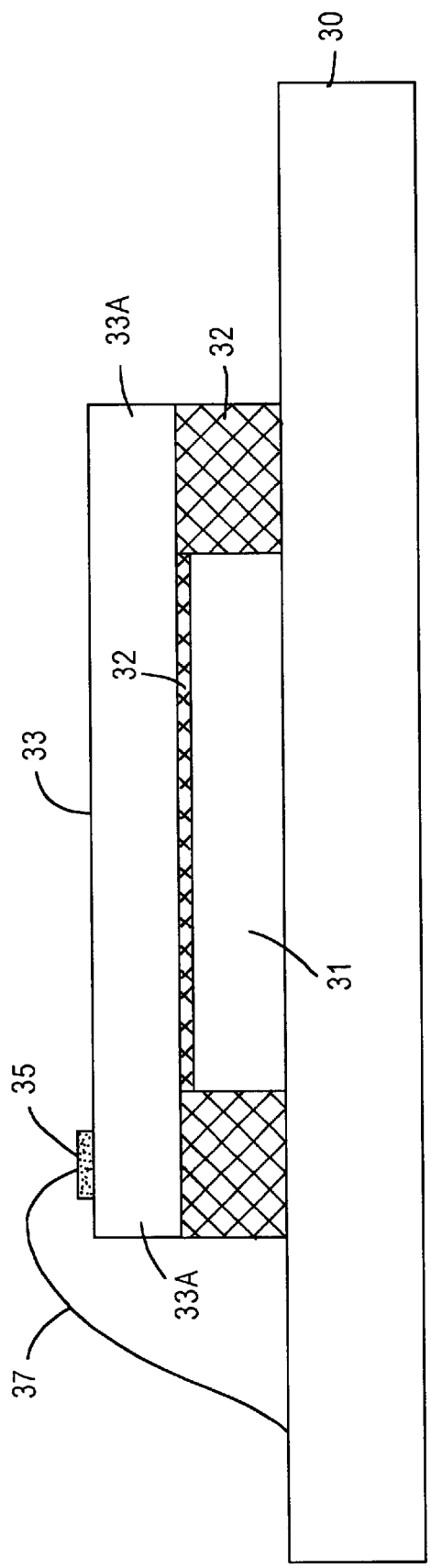
FIG. 4 schematically illustrates, in cross-sectional view, the stacked die structure of FIG. 3.

An embodiment of the present invention is schematically illustrated in FIGS. 3 and 4, wherein similar features are denoted by similar reference numerals. Adverting to FIGS. 3 and 4, substrate 30 is provided on which a first lower die 31 is mounted in a conventional manner. A dielectric support material 32, such as a molding compound or epoxy resin, is dispensed along and adjacent to side surfaces of the lower die 31. Embodiments of the present invention further include dispensing a thin film of the dielectric support material on the upper surface of lower die 31 as shown in FIG. 4. Second upper die 33 is then positioned overlying first die 31 such that portions 33A of upper die 33 overlap and, hence, extend beyond side surfaces of first lower die 31. Overlapping portions 33A of upper die 33 are supported by the underlying dielectric support material 32. Lower first die 31 contains bond pads 38 which are bonded to conductors 36 on substrate 30 by wire bonds 37. The overlapping portions 33A of second upper die 33 contain bond pads 35 which are bonded to conductors 36 on substrate 30 by wire bonds 37, one such bond pad depicted in FIG. 4 for illustrative convenience. During wire bonding to connect bond wires 37 to bond pads 35 on overlapping portions 33A, sufficient support is provided by underlying dielectric support material 32 to prevent cracking as occurs during conventional wire bonding techniques as illustrated in FIGS. 1 and 2.

The present invention is applicable to any of various types of integrated circuit packages. The present invention is particularly applicable to high-density integrated circuit packaging comprising multi-chip modules.

Only the preferred embodiment of the present invention and an example of its versatility are shown and described in the present disclosure. It is to be understood that the present invention is capable of use in various other combinations and environments, and is capable of changes or modifications within the scope of the inventive concept as expressed herein.

What is claimed is:

1. A circuit assembly comprising:
   a substrate having a main surface;
   a first die having an upper surface, a lower surface and side surfaces, the lower surface of the first die positioned on the main surface of the substrate;
   a dielectric support material adjacent at least one side surface of the first die;
   a second die, having an upper surface and a lower surface, the second die positioned such that part of the second die is supported by the dielectric support material being positioned between the second die and the first die and another part of the second die overlaps a side surface of the first die and is supported by the dielectric support material;
   a bond pad on the upper surface of the second die on the overlapping part supported by the dielectric support material; and a bond wire connected to a conductor on the main surface of the substrate and wire bonded to the bond pad.

2. The circuit assembly according to claim 1, further comprising a bonding material on the upper surface of the first die and extending adjacent the at least one side surface of the first die, the bonding material serving as the dielectric support material.

3. The circuit assembly according to claim 2, wherein the bonding material comprises a molding compound or an epoxy resin.

4. The circuit assembly according to claim 1, wherein the dielectric support material comprises a molding compound or an epoxy resin.

5. The circuit assembly according to claim 1, wherein the second die overlaps two opposing side surfaces of the first die such that each overlapping part of the second die is supported by the dielectric support material.

6. The circuit assembly according to claim 5, comprising:

a plurality of bond pads on each of the overlapping parts of the second die; and a plurality of bond wires, each bond wire connected to a conductor on the main surface of the substrate and wire bonded to one of the plurality of bond pads.

7. A method of manufacturing a circuit assembly, the method comprising:

providing a substrate having a main surface;

positioning a first die, having an upper surface, a lower surface and side surfaces, such that the lower surface of the first die is on the main surface of the substrate;

dispensing a dielectric support material adjacent at least one side surface of the first die;

positioning a second die, having an upper surface and a lower surface, such that part of the second die is supported by the dielectric support material being positioned between the second die and the first die and another part of the second die is supported by dielectric support material, the upper surface of the second die having a bond pad on an overlapping part supported by the dielectric support material; and wire bonding a bond wire to the bond pad, the bond wire being connected to a conductor on the main surface of the substrate.

8. The method according to claim 6, further comprising applying a bonding material on the upper surface of the first die and extending adjacent the at least one side surface of the first die, the bonding material serving as the dielectric support material.

9. The method according to claim 8, wherein the bonding material comprises a molding compound or an epoxy resin.

10. The method according to claim 7, wherein the dielectric support material comprises a molding compound or an epoxy resin.

11. The method according to claim 7, comprising positioning the second die overlapping two opposing side surfaces of the first die, such that each overlapping part of the second die is supported by the dielectric support material.

12. The method according to claim 11, wherein the upper surface of the second die contains a plurality of bond pads on each of the overlapping parts; the method comprising wire bonding a bond wire to each bond pad.

* * * * *